(12) United States Patent
Lin et al.

(10) Patent No.: US 8,218,708 B2
(45) Date of Patent: *Jul. 10, 2012

(54) PHASE SPLITTER USING DIGITAL DELAY LOCKED LOOPS

(75) Inventors: Feng Lin, Boise, ID (US); R. Jacob Baker, Meridian, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/987,431

(22) Filed: Jan. 10, 2011

(65) Prior Publication Data

US 2011/0102036 A1 May 5, 2011

Related U.S. Application Data

(63) Continuation of application No. 11/216,778, filed on Aug. 31, 2005, now Pat. No. 7,873,131, which is a continuation of application No. 09/861,121, filed on May 18, 2001, now Pat. No. 6,950,487.

(51) Int. Cl.
*H03D 3/24* (2006.01)

(52) U.S. Cl. ........ 375/376; 375/371; 375/375; 327/149; 327/153; 327/156; 327/158; 327/159; 327/161; 327/163

(58) Field of Classification Search .......... 375/371–376; 327/144–163
See application file for complete search history.

(56) References Cited

U.S. PATENT DOCUMENTS

| | | | |
|---|---|---|---|
| 5,963,069 A | 10/1999 | Jefferson et al. | |
| 6,011,732 A | 1/2000 | Harrison et al. | |
| 6,125,157 A * | 9/2000 | Donnelly et al. | ............. 375/371 |
| 6,137,325 A | 10/2000 | Miller, Jr. | |
| 6,289,068 B1 | 9/2001 | Hassoun et al. | |
| 6,385,126 B2 | 5/2002 | Jung et al. | |
| 6,445,231 B1 | 9/2002 | Baker et al. | |
| 6,539,072 B1 | 3/2003 | Donnelly et al. | |
| 6,777,995 B1 | 8/2004 | Harrison | |
| 6,839,860 B2 * | 1/2005 | Lin | ............................ 713/401 |
| 6,950,487 B2 * | 9/2005 | Lin et al. | ....................... 375/376 |
| 7,873,131 B2 * | 1/2011 | Lin et al. | ....................... 375/376 |

* cited by examiner

*Primary Examiner* — Curtis Odom
(74) *Attorney, Agent, or Firm* — Lerner, David, Littenberg, Krumholz & Mentlik, LLP

(57) ABSTRACT

A phase splitter uses digital delay locked loop (DLL) to receive complementary input clock signals to generate a plurality of output signals having different phase shifts. When the DLL is locked, the delay resolution of the phase splitter is equal to two delay stages of the DLL.

18 Claims, 10 Drawing Sheets

PHASE SPLITTER USING DIGITAL DELAY LOCKED LOOPS

CROSS-REFERENCE TO RELATED APPLICATIONS

This application is a continuation of U.S. application Ser. No. 11/216,778, filed Aug. 31, 2005, now U.S. Pat. No. 7,873, 131 issued Jan. 18, 2011, which application is a continuation of application Ser. No. 09/861,121, filed May 18, 2001, now U.S. Pat. No. 6,950,487 issued Sep. 27, 2005, the disclosures of which are hereby incorporated herein by reference.

TECHNICAL FIELD OF THE INVENTION

The present invention relates generally to integrated circuits (ICs), and in particular to generating multiple clock signals for an IC.

BACKGROUND OF THE INVENTION

In an integrated circuit, a clock signal having a different phase shift with the system clock signal is sometimes required for a specific function. For instance, in one method of capturing a data signal, a clock signal 90 degrees out of phase with the system clock is needed. This clock signal is normally referred to as a quadrature clock signal.

Conventionally, the quadrature clock signal can be generated by a phase splitter using analog or digital delay locked loop (DLL). A traditional phase splitter using digital DLL has four delay segments connected in series. Each of the delay segments has a plurality of delay stages to provide a quarter of clock cycle delay to an input or system clock signal. Together, the four delay lines generate four output clock signals having 90, 180, 270 and 360 degrees out of phase with the system clock signal.

Since the traditional phase splitter using digital DLL has four delay lines connected in series, each time the DLL performs a signal synchronization to generate the output clock signals, four delay stages are used, one from each delay segment. Each delay stage includes two delay gates to avoid logic inversion. Thus, the delay resolution of the traditional digital phase splitter is equal to eight delay gates. This resolution may not provide a satisfactory level of accuracy for some devices, especially for high speed devices such as new generations of memory devices.

There is a need for improving the delay resolution of digital phase splitters for producing multiple clock signals.

BRIEF SUMMARY OF TEE INVENTION

The present invention includes a phase splitter using digital delay locked loop (DLL) to receive complementary input clock signals to generate a plurality of output signals having different phase shifts. When the DLL is locked, the delay resolution of the phase splitter is equal to two delay gates of the DLL.

In one aspect, an apparatus includes a plurality of memory cells and a circuit for providing timing for data transferred to and from the memory cells. The circuit includes a forward path, a phase detector and a controller. The forward path delays a first input clock signal to produce a first output clock signal and a second output clock signal. The phase detector provides shifting signals based on the second output clock signal and a second input clock signal. The controller adjusts a delay of the forward path based on the shifting signals. The adjusted delay causes the first output clock signal to be one-fourth clock cycle delayed from the first input clock signal, and the second output clock signal to be one-half clock cycle delayed from the first input clock signal.

In another aspect, an apparatus includes a plurality of memory cells and a circuit for providing timing for data transferred to and from the memory cells. The circuit includes a first delay line, a second delay line, a feedback path, a phase detector and a controller. The first delay line applies a delay to a first input clock signal to produce a first output clock signal. The second delay line applies the delay to the first output clock signal to produce a second output clock signal. The feedback path provides a feedback signal based on the second output clock signal. The phase detector provides shifting signals based on the feedback signal and a second input clock signal. The controller adjusts the delay applied to the first and second delay lines based on the shifting signals. The adjusted delay causes the first output clock signal to be 90 degrees out of phase with the first input clock signal, and the second output clock signal to be 180 degrees out of phase with the first input clock signal.

In another aspect, a system includes a processor, a dynamic random access memory device, and a memory controller coupled to the processor and the dynamic random access memory device. The memory controller includes a circuit for providing timing for data transferred to and from the memory device. The circuit includes a forward path, a phase detector, and a controller. The forward path delays a first input clock signal to produce a first output clock signal and a second output clock signal. The phase detector provides shifting signals based on the second output clock signal and a second input clock signal. The controller adjusts a delay of the forward path based on the shifting signals. The adjusted delay causes the first output clock signal to be one-fourth clock cycle delayed from the first input clock signal, and the second output clock signal one-half clock cycle delayed from the first input clock signal.

In another aspect, a method includes applying a delay to a first input clock signal to produce a first output clock signal and a second output clock signal. The second output clock signal is compared with a second input clock signal for providing shifting signals. The delay is adjusted based on the shifting signals for causing the first output clock signal to be 90 degrees out of phase with the first input clock signal, and the second output clock signal to be 180 degrees out of phase with the first input clock signal. Data is transferred with a memory device using timing provided by at least one of the first and second output clock signals.

DETAILED DESCRIPTION

The following detailed description refers to the accompanying drawings which form a part hereof, and show by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
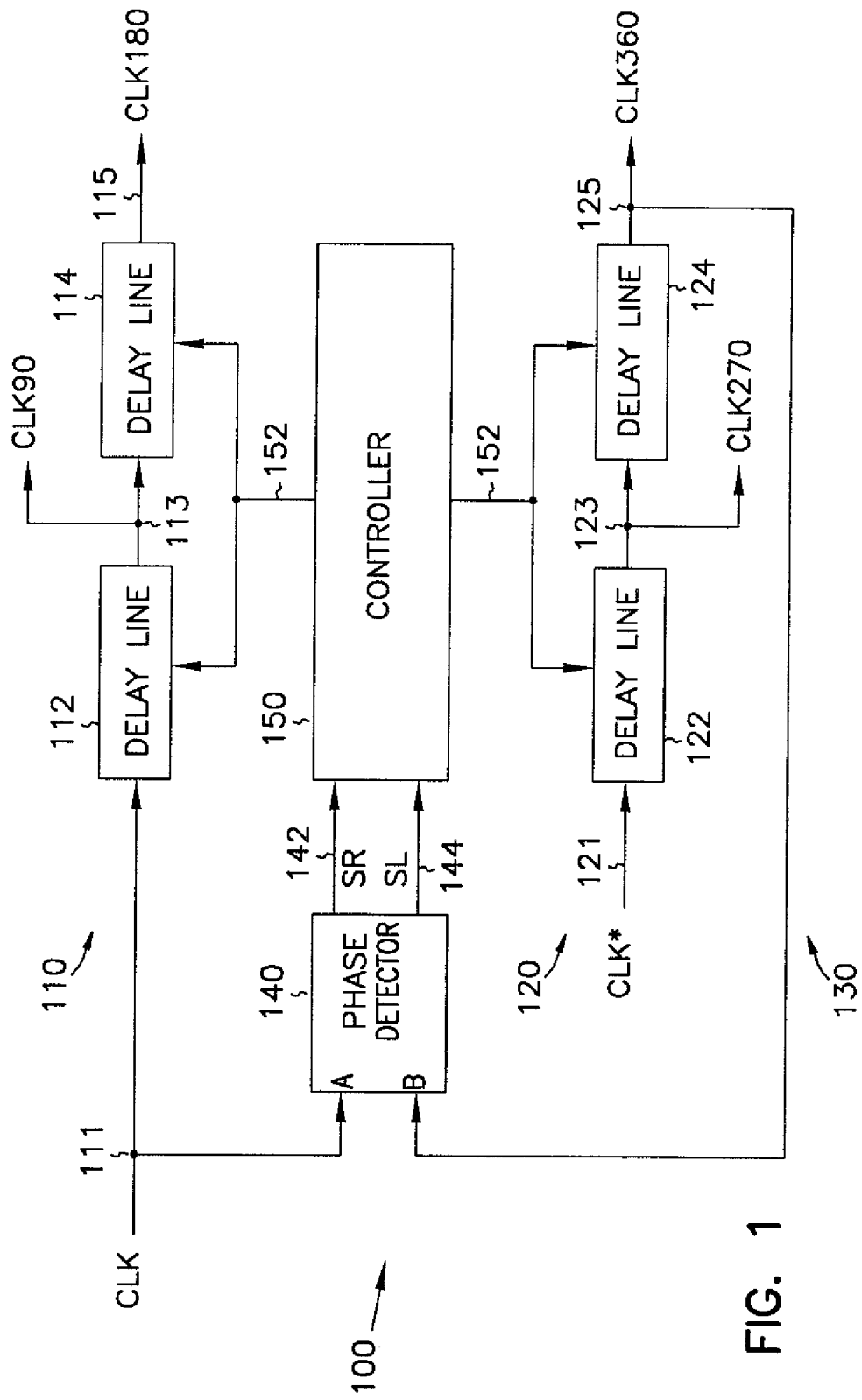
FIG. 1 is a block diagram of a phase splitter according to one embodiment of the invention.

FIG. 1 is a block diagram of a phase splitter according to one embodiment of the invention. Digital phase splitter 100 includes first and second forward paths 110 and 120, and a feedback path 130. Each of the forward paths 110 and 120 includes two delay lines.

Forward path 110 includes a delay line 112 connected to another delay line 114. Delay line 112 has an output at node 113 to provide a first output clock signal or a quadrature signal CLK90. Delay line 114 has an output at node 115 to provide a second output clock signal CLK180.

Forward path 120 includes a delay line 122 connected to another delay line 124. Delay line 122 has an output at node 123 to provide a third output clock signal CLK270. Delay line 124 has an output at node 125 to provide a fourth output clock signal CLK360.

Forward paths 110 has an input node 111 to receive an input signal CLK. Forward path 120 has an input node 121 to receive a second input clock signal CLK*. The CLK and CLK* signals are complementary clock signals. In other terms, each of the clock signals CLK and CLK* is an inverse of the other.

Delay lines 112, 114, 122 and 124 have the same initial setting. That is each of the delays lines 112, 114, 122 and 124 has the same number of delay stages initially set to provide the same amount of delay. When phase splitter 100 is in a locked position, each of the delay lines 112, 114, 122 and 124 provides a quarter (one-fourth) of clock cycle (clock period) delay.

Phase splitter 100 also includes a phase detector 140 and a controller 150. Controller 150 connects to the first and second forward paths 110 and 120 via a plurality of control lines 152. Phase detector 140 has an input A connected to node 111 to receive the CLK signal, and an input B connected to node 125 to receive the feedback signal (CLK360). Phase detector 140 connects to controller 150 via lines 142 and 144 to provide shifting signals. The shifting signals include a shift right (SR) provided on line 142 and a shift left (SL) provided on line 144.

Feedback path 130 connects between the output of delay line 124 at node 125 and input B of phase detector 140. In the embodiment of FIG. 1, feedback path 130 receives the CLK360 signal and uses it as a feedback signal and passes this feedback signal to input B of phase detector 140.

Figure 2:
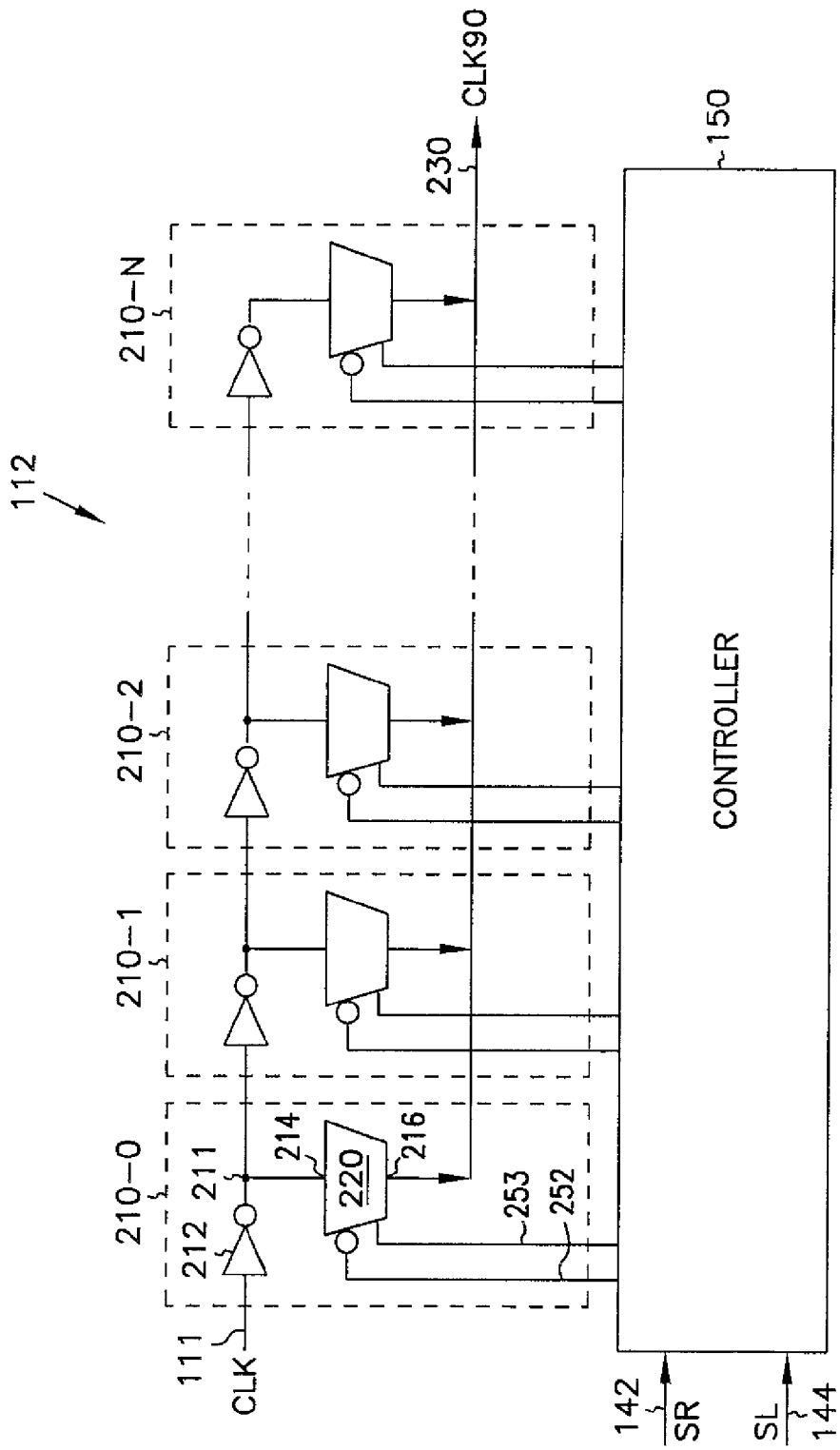
FIG. 2 is a schematic diagram of a delay line of the phase splitter of FIG. 1.

FIG. 2 is a schematic diagram of one embodiment of a delay line of the phase splitter 100 of FIG. 1. For simplicity, FIG. 2 only shows a schematic diagram of delay line 112; other delay lines 114, 122 and 124 have the same construction. Delay line 112 includes a plurality of delay stages 210-0, 210-1, 210-2 through 210-N. Each of the delay stages 210 0-N includes a delay element 212. In FIG. 2, delay element 212 is an inverter. In other embodiments, however, delay element 212 can be a NAND gate or other logic gates. The output of invertor 212 of each of the delay stages 210 0-N connects to the input of the inverter 212 of the adjacent delay stage at node 211 such as is illustrated in delay stage 210-0. The input of inverter 212 of first delay stage 210-0 connects to node 111 to receive the CLK signal.

Each of the delay stages 210 0-N also includes a multiplexor (MUX) 220. MUX 220 has an input at node 214, an output at node 216, and select lines 252 and 253. MUX 220 connects to controller 150 via select lines 252 and 253. Select lines 252 and 253 are represented in FIG. 1 by line 152. Input 214 of each MUX 220 connects to node 211 for a respective delay stage at the output of the inverter 212 of the same delay stage. For instance, input 214 of MUX 200 of delay stage 210-0 connects to the output of inverter 212 of the same delay stage 210-0. The output of each MUX 220 connects to a common output line 230. Line 230 of FIG. 2 is represented in FIG. 1 as node 113 associated with delay line 112. Each time, only one mutliplexer of the delay line can be selected to pass the clock signal.

Figure 3:
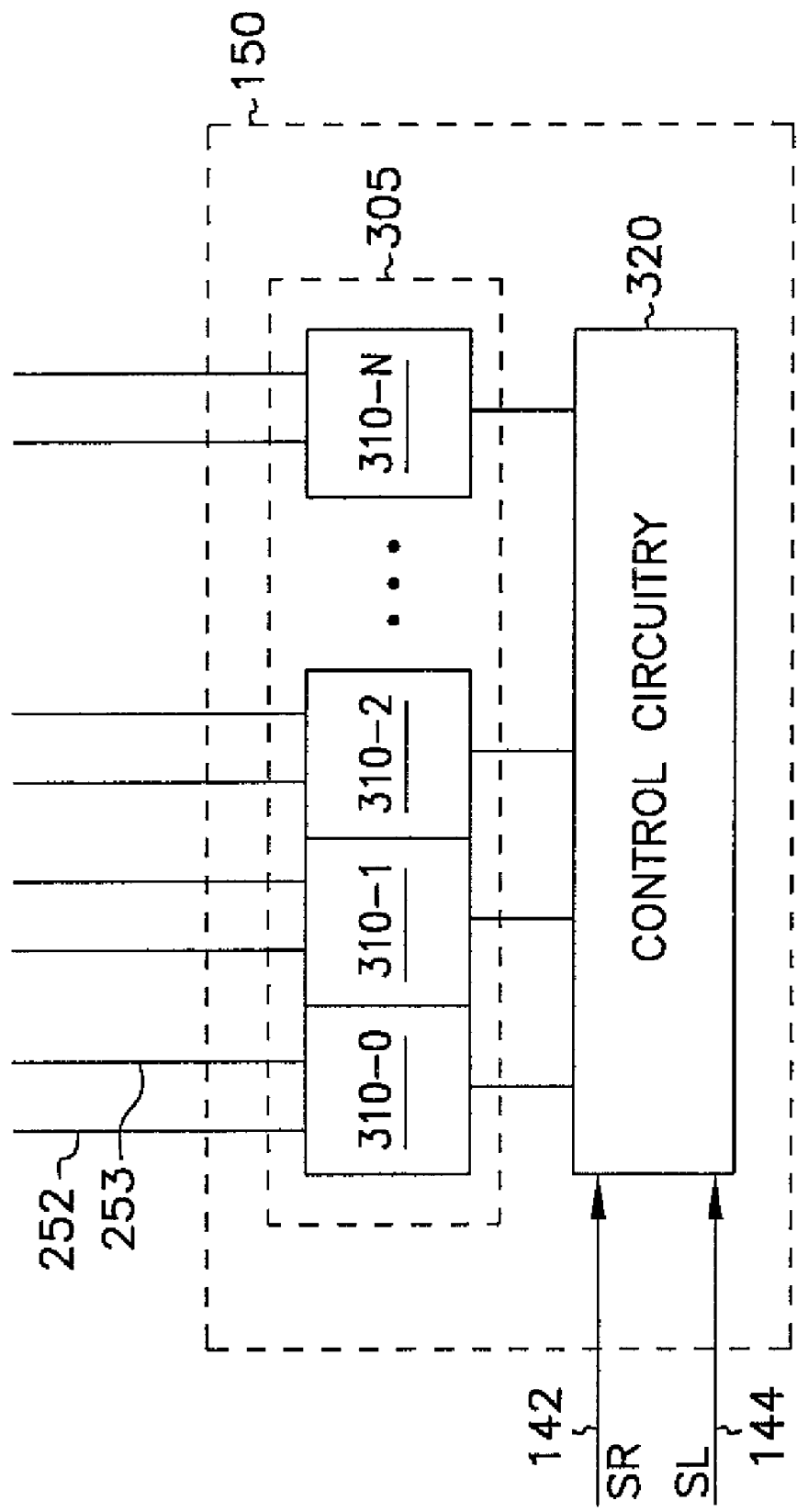
FIG. 3 is a block diagram of a controller of the phase splitter of FIG. 1.

FIG. 3 is a block diagram of controller 150 of phase splitter 100 of FIG. 1. Controller 150 includes a shift register 305 connected to a register control circuitry 320. Shift register 305 includes a plurality of shift register cells 310-0 to 310-N (310 0-N). Each of the register cells 310 0-N connects to one MUX 220 via lines 252 and 253 for each delay stage. The number of shift register cells 310 0-N is equal to the number of delay stages 210 0-N. Control circuitry 320 connects to lines 142 and 144 shown in FIG. 1, to receive the SR and SL signals.

In general, referring to FIG. 1, phase splitter 100 receives the complementary clock signals CLK and CLK* at forward paths 110 and 120. Forward path 110 applies an appropriate amount delay to the CLK signal to generate the CLK90 and CLK1 80 signals. Similarly, forward path 120 applies the same amount of delay to the CLK* signal to generate the CLK270 and CLK360 signals. In other words, the amount of delay applied to each of the delay lines 112, 114, 122 and 124 is the same. During operation, phase detector 140 compares the feedback and CLK signals. In this case, the feedback signal is the CLK360 signal. Based on the phase relationship between these two signals, phase detector 140 generates either the SR or SL signal. Controller 150 receives the SR or SL signal and performs a shifting operation to adjust the amount of delay applied to the CLK and CLK* signals. When the CLK360 and CLK signals are synchronized, phase detector 140 disables or deactivates the SR and SL signals. Consequently, controller 150 stops performing the shifting operation. At this point phase splitter 100 is in a locked position.

When phase splitter 100 is locked (when the CLK360 and CLK signals are synchronized) the quadrature clock signal or the CLK90 output clock signal is one-fourth clock cycle delayed from the CLK signal; and each of the other output clock signals CLK180, CLK270 and CLK360 is a multiple of one-fourth clock cycle delayed from the CLK signal. In other words, when the CLK360 and CLK signals are synchronized, the CLK90, CLK180, CLK 270 and CLK360 are 90, 180, 270 and 360 degrees out of phase with the CLK signal.

The operation of phase splitter 100 of FIG. 1 is further understood with the description of the operation of delay line 112 of FIG. 2. The operations of other delay lines 114, 122 and 124 are the same as the operation of delay line 112. In FIG. 2, delay line 112 receives the CLK signal at nodes 111. The CLK signal propagates following a path starting from node 111 through a certain number of delay stages 210 0-N and through one of the MUXs 220 before arriving at output node 230. Since each of the delay stages 210 0-N has one inverter 212, the amount of delay applied to the CLK signal depends on the number, e.g., how many of the inverters 221 it has propagated through.

At the start of the operation, delay line 112 applied an initial amount of delay to the CLK signal by using an initial or a predetermined number of delay stages 210 0-N. The predetermined number of delay stages is initially set by controller 150. In subsequent actions of the operation, controller 150 selects a different number of delay stages to adjust, e.g., increase or decrease the amount of delay by increasing or decreasing the number of delay stages. Thus, the amount of delay is proportional to the number of the selected delay stages through which the CLK signal passes. In other terms, when the number of delay stages increases, the amount of delay applied to the CLK signal is increased. Conversely, when the number of delay stages decreases, the amount of delay is decreased.

To select a different number of delay stages, controller 150 selects a different MUX 220 by activating select lines 252 and 253 of the selected MUX. Based on the SR or SL signal provided by phase detector 140 on lines 142 and 144, controller 150 performs a shifting operation to select a MUX to the right or left of the current MUX. Thus, only one MUX 220 is selected and is activated to pass the CLK signal from node 111 to node 230.

As an example, in FIG. 2, assuming that MUX 220 of delay stage 210-1 is selected. This selected MUX can be an initial selected MUX at the beginning of the operation or a current selected MUX after at least one shifting operation performed by controller 150. In this example, the CLK signal propagates through two delay stages 210-0 and 210-1. If controller 150 received the SR (shift right) signal, it will perform a shift right operation to increase the amount of delay by de-selecting MUX 220 of delay stage 210-1 and selecting MUX 220 of delay stage 210-2. As a result, the CLK signal will propagate through three delay stages 210 0-2. Back to the initial assumption, if controller 150 received the SL (shift left) signal (instead of the SR signal), it will perform a shift left operation to decrease the amount of delay by de-selecting MUX 220 (initial selected MUX) of delay line 210-1 and selecting MUX 220 of delay stage 210-0. As a result, the CLK signal will propagate through one delay stage 210-0.

From the example above, for each shifting operation, the delay applied to the CLK signal is decreased or increased by one delay stage. In the embodiment of FIG. 2 in which each of the delay stages 210 0-N includes one inverter 212, the delay of each stage is equal to one inverter delay, which is about 100 picoseconds.

Referring to FIG. 1, delay lines 112, 114, 122 and 124 are constructed the same and operate in the same manner as described in FIG. 2. Thus, for each shifting operation, the amount of delay in each delay line varies by one delay stage, which in this embodiment is one inverter delay. However, since delay line 114 or 124 receives input from delay lines 112 or 122, for each shifting operation, the amount of delay of the input clock signal CLK, CLK* varies by two delay stages or two inverter delays. In other words, for each shifting operation, the total amount of delay is equal to one inverter delay of delay line 124 plus one inverter delay caused by delay line 122.

Since the CLK360 is provided by the output of delay line 124, for each shifting operation, the amount of delay applied to the CLK* is varied by two inverter delays. Because the CLK360 is used as a feedback signal by phase detector 140 to provide a clock synchronization, the delay resolution of phase splitter 100 is equal to two inverter delays. In other words, the delay resolution of phase splitter 100 is equal to two delay gates, which is about 200 picoseconds (100 picoseconds for each inverter).

Figure 4:
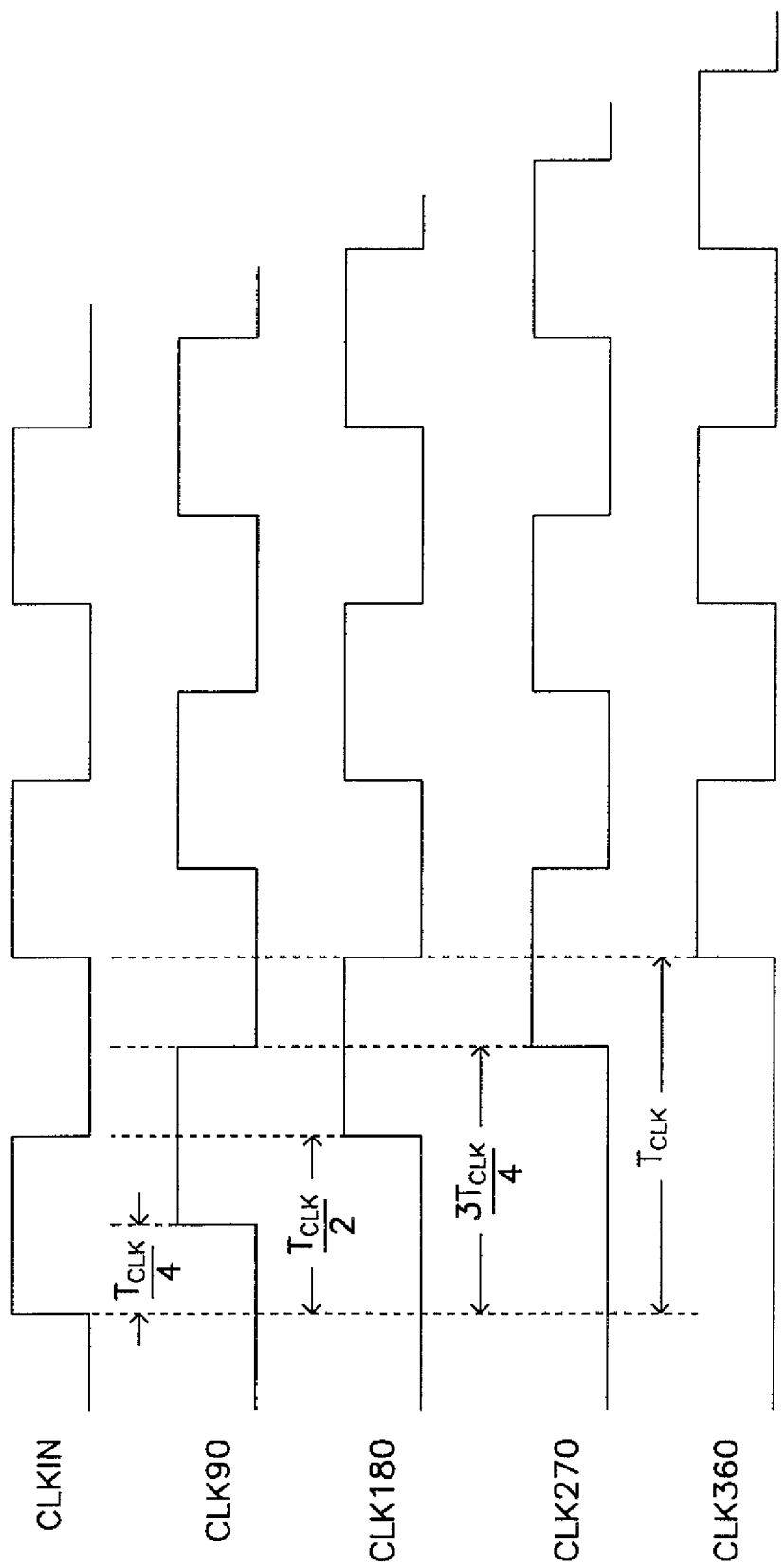
FIG. 4 is a timing diagram of output clock signals generated by the phase splitter of FIG. 1.

FIG. 4 is a timing diagram of the output clock signals generated by phase splitter 100 of FIG. 1. When phase splitter 100 is in a locked position, that is, when the CLK360 and CLK signals are synchronized, the CLK90 signal is 90 degrees or one-fourth clock cycle delayed from the CLK signal, as indicated by $T_{CLK}/4$. The CLK180 signal is 180 degrees or one-half clock cycle delayed from the CLK signal, as indicated by $T_{CLK}/2$. The CLK270 signal is 270 degrees or three-fourths clock cycle delayed from the CLK signal, as indicated by $3T_{CLK}T/4$. The CLK360 signal is 360 degrees or one clock cycle delayed from the CLK signal, as indicated by $T_{CLK}$.

Figure 5:
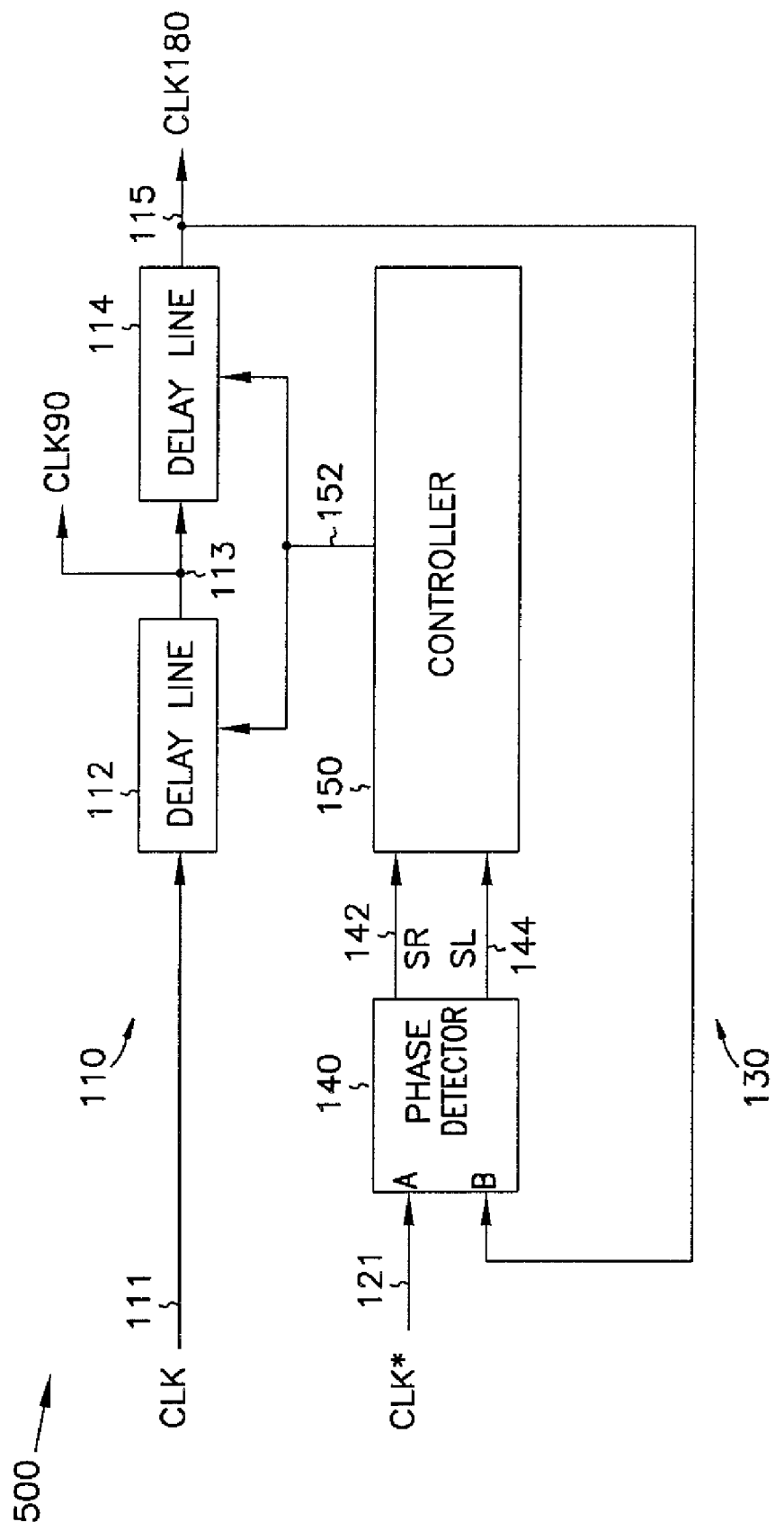
FIG. 5 is a block diagram of a phase splitter according to another embodiment of the invention.

FIG. 5 is a block diagram of a phase splitter according to another embodiment of the invention. Phase splitter 500 is a variation of phase splitter 100. For simplicity, similar elements in both phase splitters have the same reference numbers. In the embodiment of FIG. 5, phase splitter 500 includes only two delay lines 112 and 114. Inputs A and B of phase detector 140 receive the CLK* and CLK180 signals instead of the CLK and CLK360 signals. Feedback path 130 in this variation connects between the output of delay line 114 at node 115 and input B of phase detector 140. The quadrature clock signal (CLK90) is still provided at node 113.

Operation of phase splitter 500 is similar to the operation of phase splitter 100. Phase detector 140 compares the CLK180 and CLK* signals to provide a clock synchronization. The delay resolution of phase splitter 500 is still equal to two inverter delays because each of the delay stages still has one inverter.

Figure 6:
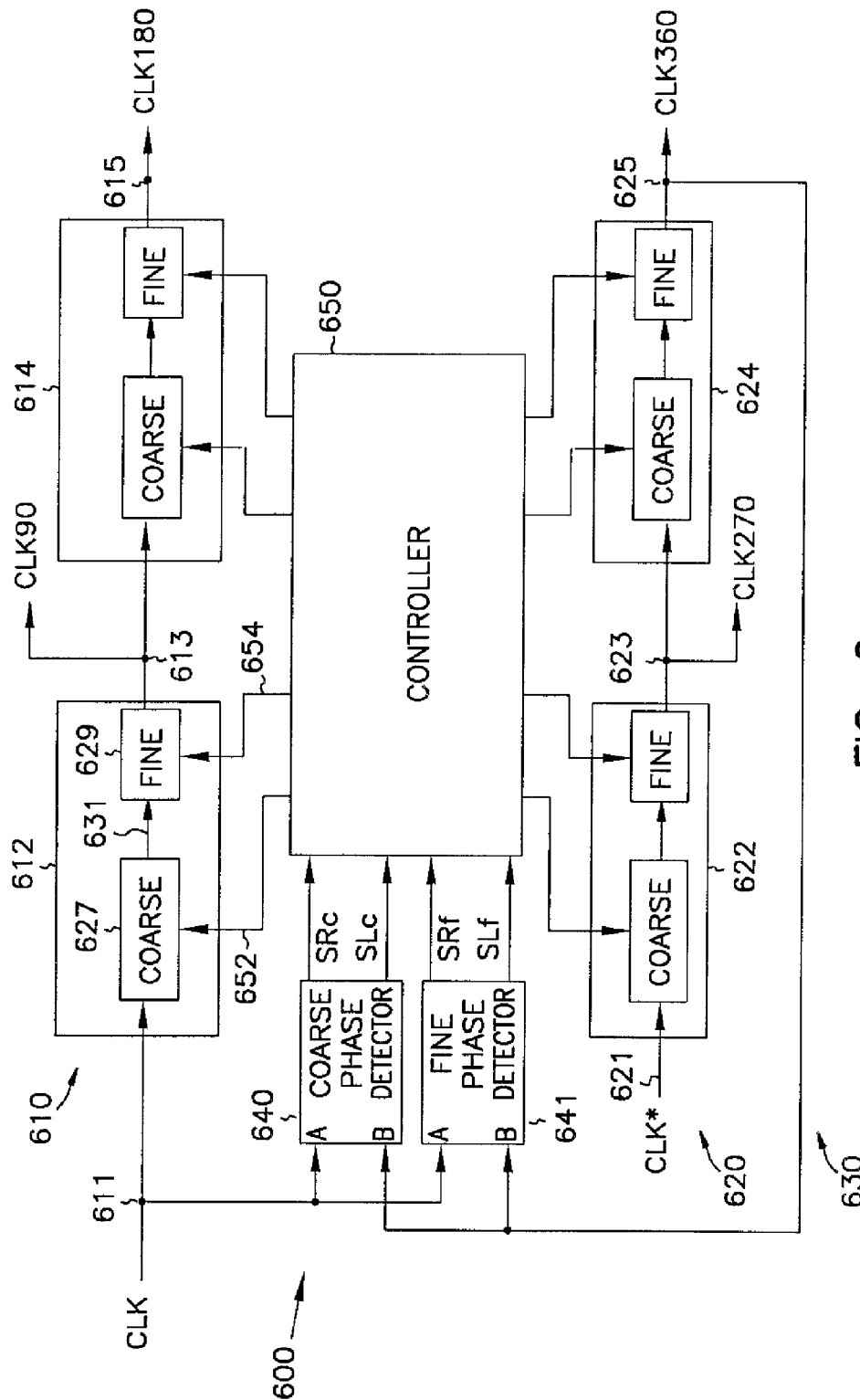
FIG. 6 is a block diagram of a phase splitter according to another embodiment of the invention.

FIG. 6 is a block diagram of a phase splitter according to another embodiment of the invention. Digital phase splitter 600 is arranged in a similar configuration as phase splitter 100. Phase splitter 600 includes first and second forward paths 610 and 620, and a feedback path 630. Each of the forward paths 610 and 620 includes two delay lines. In this case, each delay line can include a coarse delay segment and a fine delay segment. The fine delay is less than the coarse delay.

Forward path 610 includes a delay line 612 connected to another delay line 614. Delay line 612 has an output at node 613 to provide a first output clock signal or a quadrature signal CLK90. Delay line 614 has an output at node 615 to provide a second output clock signal CLK180.

Forward path 620 includes a delay line 622 connected to another delay line 624. Delay line 622 has an output at node 623 to provide a third output clock signal CLK270. Delay line 624 has an output at node 625 to provide a fourth output clock signal CLK360.

Forward path 610 has an input node 611 to receive a first clock signal CLK. Forward path 620 has an input node 621 to receive a second clock signal CLK*. The CLK and CLK* signals are complementary clock signals.

Each of the delay lines 612 and 614 includes a coarse delay segment 627 and a fine delay segment 629. An output of coarse delay segment 627 connects to an input of fine delay segment 629 at node 631. Coarse delay segment 627 has the same construction as delay line 112 of phase splitter 100 as shown in FIG. 2. Thus, each delay stage of coarse delay segment 627 also includes one inverter such as inverter 212. Fine delay segment 629 also includes a plurality of delay stages, where each of the delay stages of fine delay segment provides a smaller amount of delay. Similar to phase splitter 100, each of the delay lines 612, 614, 622 and 624 provides a quarter (one-fourth) of clock cycle delay when phase splitter 600 is locked, which is when the CLK360 and CLK signals are synchronized.

Phase splitter 600 also includes a coarse phase detector 640, a fine phase detector 641, and a controller 650. Controller 650 connects to the first and second forward paths 610 and 620 at coarse delay segment 627 and fine delay segment 629 via a plurality of control lines 652 and 654.

Coarse phase detector 640 and fine phase detector 641 each has an input A connected to node 611 to receive the CLK signal, and an input B connected to node 625 to receive the CLK360 signal. Coarse phase detector 640 is connected to controller 650 to provide a first set of shifting signals. The shifting signals include a coarse shift right (SRc) and a coarse shift left (SLc). Fine phase detector 641 is connected to controller 650 to provide a second set of command signals or shifting signals. The shifting signals include a fine shift right (SRf) and a fine shift left (SLf).

In comparison to phase splitter 100 of FIG. 1, the interpolation of the coarse and fine delay segments 627 and 629 of phase splitter 600 further improves the delay resolution of the phase splitter. In FIG. 1, the resolution of phase splitter 100 is equal to two delay stages of the delay lines, which is equivalent to two delay stages of the coarse delay segments of phase splitter 600 of FIG. 6. In FIG. 6, however, fine loops further improve the resolution because they have a smaller delay than the delay of the coarse loops.

Figure 7:
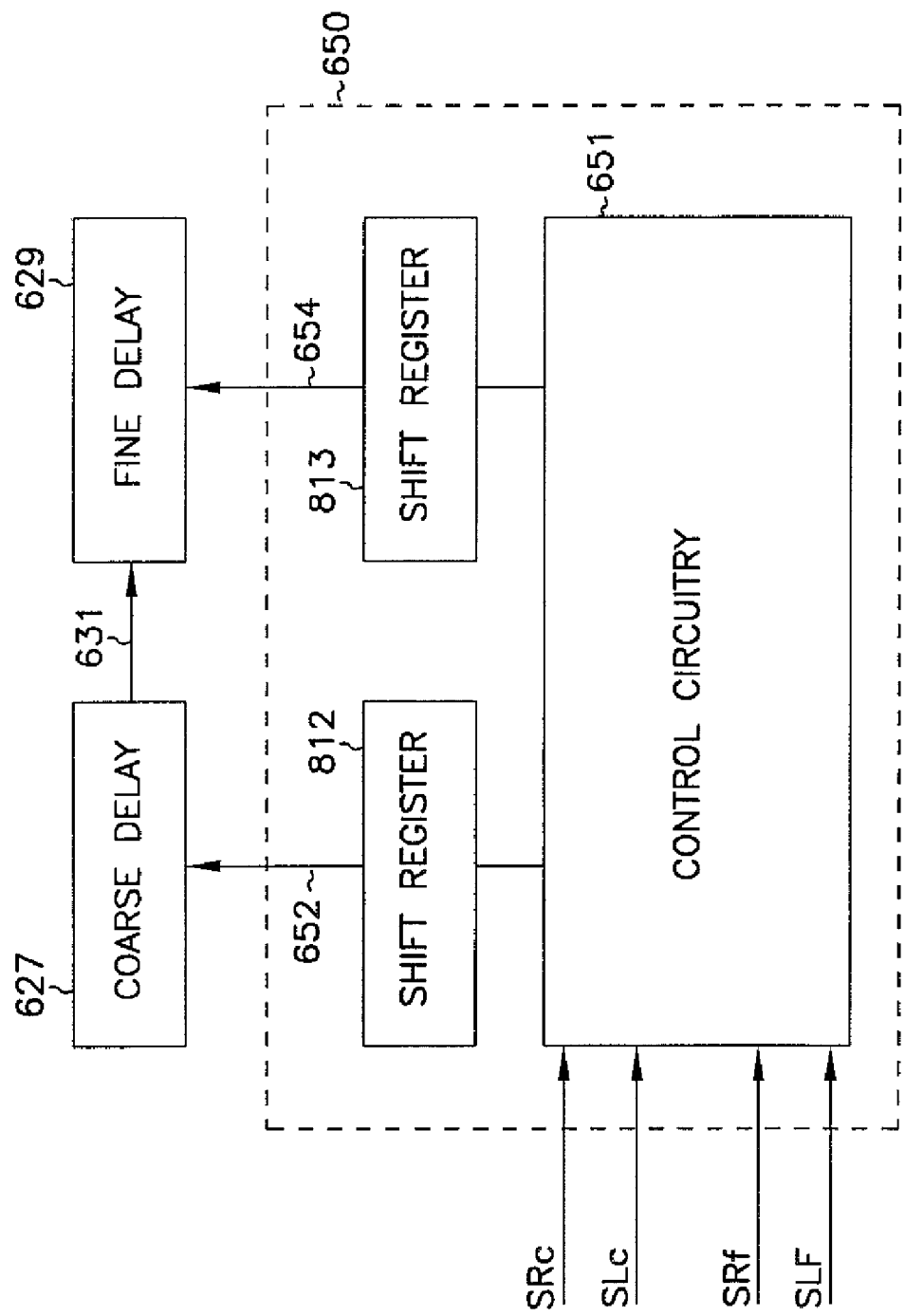
FIG. 7 is a block diagram of a controller of the phase splitter of FIG. 6.

FIG. 7 shows a block diagram of controller 650 of phase splitter 600 of FIG. 6. Controller 650 includes a control circuitry 651 connected to a first shift register 812 and second shift register 813. Shift register 812 is used to control coarse delay segment 627 and shift register 813 is used to control fine delay segment 629. In one embodiment, shift register 812 includes a plurality of register cells such as those shown as register cells 314 0-N in FIG. 3 connected to a plurality of delay stages of coarse delay segment similar to the delay stages 210 0-N shown in FIG. 2. In one embodiment, shift register 813 includes a plurality of register cells similar to register cells 314 0-N of FIG. 3, in which each of the register cells connects to one delay stage of fine delay segment 629.

The operation of phase splitter 600 includes a coarse delay operation and a fine delay operation. The coarse delay operation is the same as the operation of phase splitter 100. In this operation, coarse phase detector 640 compares the CLK360 and CLK signal and provides either the SRc or SLc to control circuitry 651. Control circuitry 651 enables shift register 812 to apply an appropriate amount of delay to the CLK and CLK* signals. When the CLK360 and CLK are synchronized, phase detector 640 disables the SRc and SLc signals which causes shift register to stop shifting. At this point, phase splitter 600 provides the four output clock signals CLK90, CLK1 80, CLK270 and CLK360 with a delay resolution equal to two delay stages of coarse delay segment 627. Since coarse delay segment 627 is the same as delay line 112, the delay resolution of the coarse delay operation is equal to two inverter delays, which is about 200 picoseconds.

The fine delay operation further improves the delay resolution of phase splitter 600 after the coarse delay operation. Following the coarse delay operation, fine delay segment 629 receives the signal from the output of coarse delay segment 627 at node 631. At this time, phase detector 640 is idling and phase detector 641 activates the SRf or SLf signals. Control circuitry 651 causes shift register 813 to enable fine delay segment 629 to further improve the delay resolution. After the fine delay operation is done, the delay resolution of phase splitter is equal to two delay stages of fine delay segment 629.

Accordingly, the delay resolution of the phase shift is about 60 picoseconds, when the fine delay per stage is about 30 picoseconds.

Figure 8:
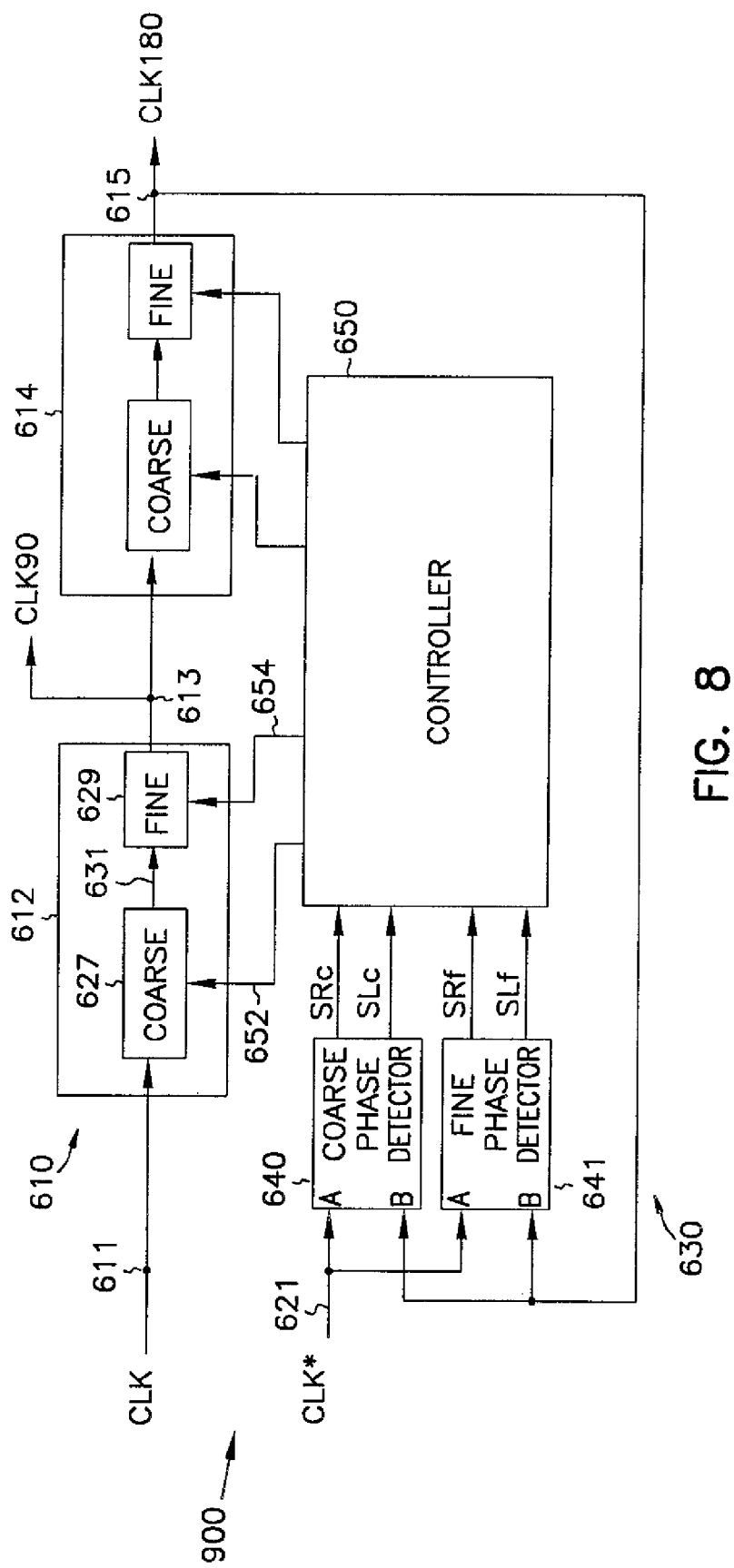
FIG. 8 is a block diagram of a phase splitter according to another embodiment of the invention.

FIG. 8 is a block diagram of a phase splitter according to another embodiment of the invention. Digital phase splitter 900 is a hybrid of the phase splitters 600 as shown in FIGS. 5 and 6. For simplicity, similar elements in both phase splitters have the same reference numbers. In the embodiment of FIG. 8, phase splitter 900 includes only two delay lines 612 and 614. Inputs A and B of phase detector 640 and 641 receive the CLK* and CLK180 signal. In this variation, feedback path 630 connects between the output of delay line 614 at node 615 and inputs B of phase detector 640 and 641. The quadrature clock signal (CLK90) is still provided at node 613.

Operation of phase splitter 900 is similar to the operation of phase splitter 600. Coarse phase detector 640 and fine phase detector 641 compare the CLK180 and CLK* signals to provide a clock synchronization. The coarse delay operation provides a delay resolution of two coarse delay stages which is about 200 picoseconds. The fine delay operation improves the delay resolution of phase splitter 900 to two fine delay stages which is about 60 picoseconds.

The embodiments of the phase splitters described above only represent some exemplary configurations of a digital phase splitter according to the invention. In another embodiment, a different configuration of the phase splitter can be used to generate multiple output signals such as the output signals CLK90, CLK180, CLK270 but using different combination of delay lines. For example, in one embodiment, the phase splitter has a configuration that is similar to phase splitter 100 or 600 but includes only three delay lines, two delay lines in a first forward path and only one delay line in a second forward path.

In yet another embodiment, the phase splitter has similar configuration as phase splitter 500 but generates multiple output signals having phase shift other than 90 degrees. For example, the phase splitter can generate multiple output signals having 60, 120 or 180 degrees out of phase with the external clock signal. In that case, the phase splitter has three delay lines (instead of two) connected in series in one forward path.

Based on the phase splitters shown in FIGS. 1, 5, 6 and 8, other configurations of the phase splitter can be implemented. Therefore, the phase splitter according to the invention is not limited to those shown in FIGS. 1, 5, 6 and 8, or to the configurations mentioned in the previous two paragraphs. Furthermore, different configurations of the phase splitter may provide different delay resolutions. Therefore, the delay resolution of the phase splitter in other embodiments may not be the same as the delay resolution of the phase splitters described in FIGS. 1, 5, 6 and 8.

Figure 9:
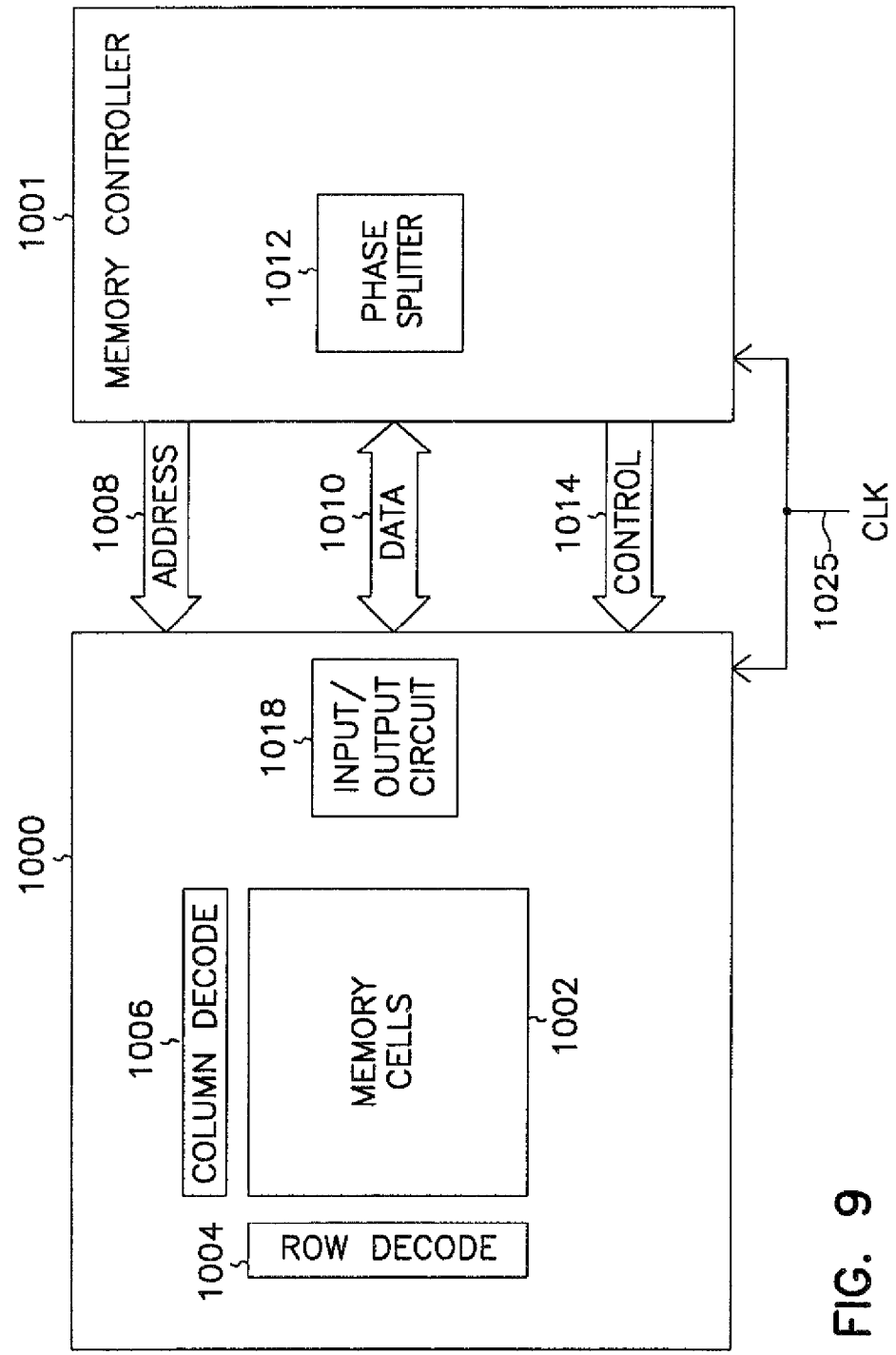
FIG. 9 is a block diagram of a memory device including the phase splitter according to the invention.

FIG. 9 is a block diagram of a memory system 1000 according to one embodiment the invention. Memory system includes a memory device 1000 and a memory controller 1001. Memory device 1000 includes a plurality of memory cells 1002 generally arranged in rows and columns. Row decode circuit 1004 and column decode circuit 1006 access the rows and columns in response to an address, provided on a plurality of address lines 1008. Data communication to and from memory device 1000 are transmitted via input/output circuit 1018 in response to command signals on control lines 1014. Both memory device 1000 and memory controller 1001 receive an external clock signal CLK on line 1025. Memory controller 1001 includes a phase splitter 1012. Phase splitter 1012 represents phase splitter 100, 500, 600 or 900 according to the invention. Data is transferred between memory controller 1001 and memory device 1000 through data lines 1010.

According to the invention, phase splitter 1012 receives the CLK signal on line 1025 to generate a plurality of output signals such as the CLK90, CLK180, CLK270 and CLK360 signals of FIGS. 1, 5, 6 and 8. The CLK signal on line 1025 of FIG. 9 is shown as the CLK signal at node 111 or 611 of FIGS. 1 and 5, or 6 and 8. One of the output signals of phase splitter 1012, such as the CLK90 signal, can be used by memory controller 1001 to generate a capture signal to capture a data signal sent from memory device 1000 during a read operation. In that read operation, the capture signal is 90 degrees out of phase with the data signal. The CLK90 signal can also be used by memory controller 1001 to generate a control or address signal, which is sent to memory device 1000 during a write operation. The control or address signal is 90 degrees out of phase with the CLK signal.

Memory device 1000 of FIG. 9 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory device 1000 of FIG. 9 is simplified to illustrate one embodiment of a memory device of the present invention and is not intended to be a detailed description of all of the features of a memory device.

Figure 10:
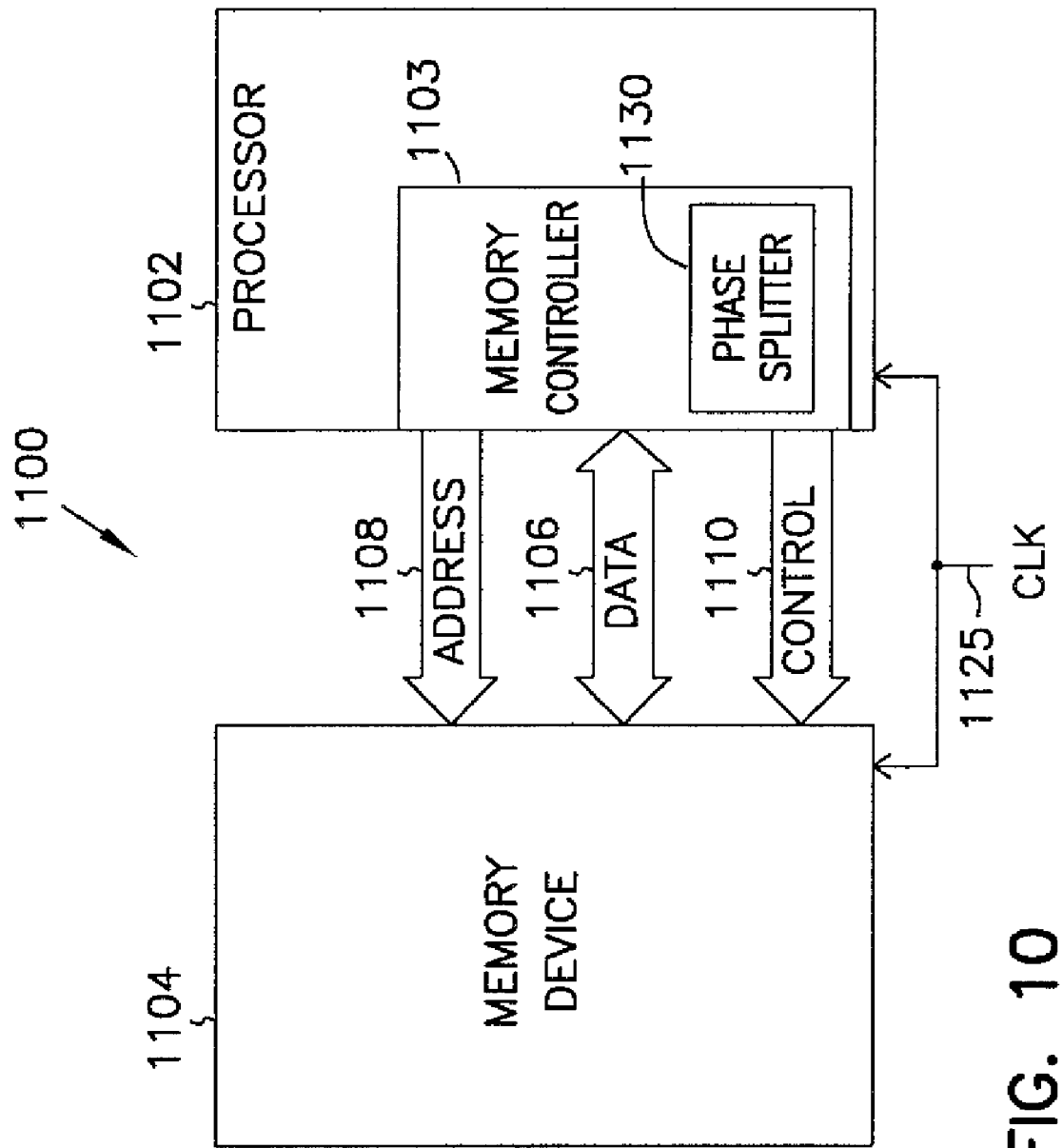
FIG. 10 is a block diagram of a system including the phase splitter according to the invention.

FIG. 10 shows a processing system 1100 according to the invention. System 1100 includes processor 1102 connected to a memory device 1104. System 1100 can also include many other devices such as, input/output devices, and others. These other devices are omitted from FIG. 10 for ease of illustration. Processor 1102 can be a microprocessor, digital signal processor, embedded processor, microcontroller, or the like. In the embodiment of FIG. 10, processor 1102 includes a memory controller 1103. However, in other embodiments such as in the embodiment of FIG. 9, memory controller 1103 is an independent device separated from processor 1102. Processor 1102 and memory device 1104 communicate using address signals on lines 1108, control signals on lines 1110, and data signals on lines 1106. Both processor 1102 and memory device 1104 receive an external clock signal CLK on line 1125.

Memory controller 1001 includes a phase splitter 1012. Phase splitter 1012 represents phase splitter 100, 500, 600 or 900 according to the invention. Data is transferred between memory controller 1103 and memory device 1104 through data lines 1110. According to the invention, phase splitter 1130 receives the CLK signal on line 1125 to generate a plurality output signals such as the CLK90, CLK180, CLK270 and CLK360 signals of FIGS. 1, 5, 6 and 8. The output signals can be used to generate a capture signal, a control signal, or an address signal for use during a memory operation such as the read or write operation as described in FIG. 9.

The invention claimed is:

1. An apparatus comprising:
    a plurality of memory cells; and
    a circuit for providing timing for data transferred to and from the memory cells, the circuit including:
        a forward path for delaying a first input clock signal to produce a first output clock signal and a second output clock signal;
        a phase detector for providing shifting signals based on the second output clock signal and a second input clock signal, wherein the second input clock is a complement of the first input clock signal; and
        a controller for adjusting a delay of the forward path based on the shifting signals for causing the first output clock signal to be one-fourth clock cycle delayed from the first input clock signal, and the second output clock signal to be one-half clock cycle delayed from the first input clock signal.

2. The apparatus of claim 1, wherein the forward path includes a first delay line for delaying a first input clock signal to provide the first output clock signal and a second delay line for delaying the first output clock signal to provide the second output clock signal.

3. The apparatus of claim 1, wherein each of the first and second delay lines includes a plurality of delay stages coupled in series.

4. The apparatus of claim 3, wherein the first delay line is configured for delaying the first input clock signal with a first delay, wherein the second delay line is configured for delaying the first output clock signal with a second delay, and wherein the first delay and the second delay are provided by an equal number of delay stages of the first and second delay lines.

5. The apparatus of claim 1, wherein the second input clock signal and the second output clock signals are synchronized when the second output clock signal is one-half clock cycle delayed from the first input clock signal.

6. An apparatus comprising:
    a plurality of memory cells; and
    a circuit for providing timing for data transferred to and from the memory cells, the circuit including:
        a first delay line for applying a delay to a first input clock signal to produce a first output clock signal;
        a second delay line for applying the delay to the first output clock signal to produce a second output clock signal;
        a feedback path for providing a feedback signal based on the second output clock signal;
        a phase detector for providing shifting signals based on the feedback signal and a second input clock signal, wherein the second input clock signal is an inverse of the first input clock signal; and
        a controller for adjusting the delay applied to the first and second delay lines based on the shifting signals for causing the first output clock signal to be 90 degrees out of phase with the first input clock signal, and the second output clock signal to be 180 degrees out of phase with the first input clock signal.

7. The apparatus of claim 6, wherein the second input clock signal and the feedback signal are synchronized when the second output clock signal is 180 degrees out of phase with the first input clock signal.

8. The apparatus of claim 6, wherein the first delay line is configured for delaying the first input clock signal with a first delay, wherein the second delay line is configured for delaying the first output clock signal with a second delay, and wherein the first delay and the second delay are provided by an equal number of delay elements of the first and second delay lines.

9. The apparatus of claim 6, wherein the feedback signal is a copy of the second output clock signal.

10. A system comprising:
    a processor;
    a dynamic random access memory device; and
    a memory controller coupled to the processor and the dynamic random access memory device, the memory controller including a circuit for providing timing for data transferred to and from the memory device, the circuit including:
a forward path for delaying a first input clock signal to produce a first output clock signal and a second output clock signal;
a phase detector for providing shifting signals based on the second output clock signal and a second input clock signal, wherein the second input clock signal is an inverse of the first input clock signal; and
a controller for adjusting a delay of the forward path based on the shifting signals for causing the first output clock signal to be one-fourth clock cycle delayed from the first input clock signal, and the second output clock signal one-half clock cycle delayed from the first input clock signal.

11. The system of claim 10, wherein the second input clock signal and the second output clock signals are synchronized when the second output clock signal is one-half clock cycle delayed from the first input clock signal.

12. The system of claim 10, wherein the forward path includes a first delay line for delaying the first input clock signal to provide the first output clock signal, and a second delay line for delaying the first output clock signal to provide the second output clock signal.

13. The system of claim 12, wherein each of the first and second delay lines includes a plurality of delay stages coupled in series.

14. The system of claim 13, wherein the first delay line is configured for delaying the first input clock signal with a first delay, wherein the second delay line is configured for delaying the first output clock signal with a second delay, and wherein the first delay and the second delay are provided by an equal number of delay stages of the first and second delay lines.

15. A method comprising:
applying a delay to a first input clock signal to produce a first output clock signal and a second output clock signal;
comparing the second output clock signal with a second input clock signal for providing shifting signals, wherein the second input clock signal is a complement of the first input clock signal;
adjusting the delay based on the shifting signals for causing the first output clock signal to be 90 degrees out of phase with the first input clock signal, and the second output clock signal to be 180 degrees out of phase with the first input clock signal; and
transferring data with a memory device using timing provided by at least one of the first and second output clock signals.

16. The method of claim 15, wherein the second input clock signal and the second output clock signals are synchronized when first output clock signal is 90 degrees out of phase with the first input clock signal, and the second output clock signal is 180 degrees out of phase with the first input clock signal.

17. The method of claim 15, wherein applying the delay includes:
applying a first delay to the first input clock signal to provide the first output clock signal; and
applying a second delay to the first output clock signal to provide the second output clock signal.

18. The method of claim 17, wherein the first delay and the second delay are provided by an equal number of delay elements.

* * * * *

UNITED STATES PATENT AND TRADEMARK OFFICE
CERTIFICATE OF CORRECTION

PATENT NO. : 8,218,708 B2  Page 1 of 1
APPLICATION NO. : 12/987431
DATED : July 10, 2012
INVENTOR(S) : Feng Lin et al.

It is certified that error appears in the above-identified patent and that said Letters Patent is hereby corrected as shown below:

In the Specifications
Column 6, line 11, "$T_{CLK}=/2$" should read --$T_{CLK}/2$--.

In the Claims
Column 10, line 1, "second input clock is" should read --second input clock signal is--.

Signed and Sealed this
Twenty-fourth Day of December, 2013

Margaret A. Focarino
*Commissioner for Patents of the United States Patent and Trademark Office*